(12) United States Patent
Chen et al.

(10) Patent No.: US 9,548,276 B2
(45) Date of Patent: Jan. 17, 2017

(54) STRUCTURE OF BACKSIDE COPPER METALLIZATION FOR SEMICONDUCTOR DEVICES AND A FABRICATION METHOD THEREOF

(71) Applicant: WIN SEMICONDUCTORS CORP., Taoyuan (TW)

(72) Inventors: Jason Chen, Tao Yuan Shien (TW); Chang-Hwang Hua, Tao Yuan Shien (TW); Wen Chu, Tao Yuan Shien (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 0 days.

(21) Appl. No.: 14/868,798

(22) Filed: Sep. 29, 2015

(65) Prior Publication Data

US 2016/0020178 A1 Jan. 21, 2016

Related U.S. Application Data

(63) Continuation-in-part of application No. 13/555,793, filed on Jul. 23, 2012, now abandoned.

(30) Foreign Application Priority Data

Apr. 18, 2012 (TW) .............................. 101113779 A

(51) Int. Cl.
*H01L 23/48* (2006.01)
*H01L 23/00* (2006.01)
*H01L 21/768* (2006.01)
*H01L 23/482* (2006.01)
*H01L 23/532* (2006.01)

(52) U.S. Cl.
CPC ....... *H01L 23/562* (2013.01); *H01L 21/76858* (2013.01); *H01L 21/76871* (2013.01); *H01L 21/76898* (2013.01); *H01L 23/481* (2013.01); *H01L 23/4827* (2013.01); *H01L 21/76843* (2013.01); *H01L 23/53238* (2013.01); *H01L 2924/0002* (2013.01)

(58) Field of Classification Search
CPC ..................................................... H01L 23/562
USPC ......................................................... 257/762
See application file for complete search history.

(56) References Cited

U.S. PATENT DOCUMENTS

| | | | |
|---|---|---|---|
| 6,181,012 B1 * | 1/2001 | Edelstein | H01L 21/76843 257/751 |
| 2004/0207073 A1 | 10/2004 | Hasebe et al. | |
| 2008/0081157 A1 | 4/2008 | Schneegans et al. | |
| 2008/0210969 A1 | 9/2008 | Yuan et al. | |
| 2010/0258954 A1 * | 10/2010 | Andoh | H01L 23/49811 257/784 |
| 2011/0059610 A1 | 3/2011 | Hua et al. | |

* cited by examiner

*Primary Examiner* — Ajay K Arora
(74) *Attorney, Agent, or Firm* — Muncy, Geissler, Olds & Lowe, P.C.

(57) ABSTRACT

An improved structure of backside copper metallization for semiconductor devices and a fabrication method thereof, wherein the improved structure comprises sequentially from top to bottom an active layer, a substrate, a backside metal seed layer, a high-temperature sustaining buffer layer, a backside metal layer and at least one oxidation resistant layer, wherein the backside metal seed layer contains Pd and P, the high-temperature sustaining buffer layer is made of Ni, Ag or Ni alloys, and the backside metal layer is made of Cu. The semiconductor chip using the structure provided by the present invention can sustain high-temperature operations.

14 Claims, 11 Drawing Sheets

STRUCTURE OF BACKSIDE COPPER METALLIZATION FOR SEMICONDUCTOR DEVICES AND A FABRICATION METHOD THEREOF

CROSS-REFERENCE TO RELATED DOCUMENTS

The present invention is a continuation in part (CIP) to a U.S. patent application Ser. No. 13/555,793 entitled "An Improved Structure of Backside Copper Metallization for Semiconductor Devices and a Fabrication Method Thereof" filed on Jul. 23, 2012.

FIELD OF THE INVENTION

The present invention relates to an improved structure of the backside copper metallization for semiconductor devices and a fabrication method thereof, and particularly to semiconductor devices using copper layer as the backside metal layer, a backside metal seed layer containing Pd and P, and inserting a high-temperature sustaining buffer layer in between for sustaining high-temperature operations.

BACKGROUND OF THE INVENTION

The fabrication processes of semiconductor devices usually include a backside metallization process, which is essential for heat dissipation, the device grounding, as well as improving the die strength. FIG. 1 is a schematic showing the backside copper structure of semiconductor devices according to conventional technologies, in which the structure sequentially comprises a substrate 101, a diffusion barrier layer 105, a stress-reducing metal layer 107, a backside metal layer 109, and an oxidation resistant layer 111. The diffusion barrier layer 105 is formed below the substrate 101. The diffusion barrier layer 105 is made of TaN, which is used mainly for preventing device damages caused by the diffusion of other metal atoms into the substrate 101. The stress-reducing metal layer 107 is formed below the diffusion barrier layer 105. The stress-reducing metal layer 107 is made of Au, which can prevent metal peeling off from the underneath structure caused by the mismatched thermal expansions/contractions in different material layers. The backside metal layer 109 is made of Cu. The backside metal layer 109 should be thick enough to support the substrate 101 for sustaining the large stress during packaging processes. A thick backside metal layer is also helpful for device heat dissipation. The oxidation resistant layer 111 is made of Au, which can prevent the oxidation of the backside metal layer 109.

However, choosing TaN for the diffusion barrier layer, Au for the stress-reducing metal layer, and Cu for the backside metal layer is not adequate for semiconductor devices that demanded for high-temperature operations. The heat dissipation and thermal resistance of semiconductor devices are important topics nowadays. A semiconductor device may be damaged by over-heating when its thermal resistance is not good enough, particularly when backside via holes with large depth to width aspect ratios are presented in the semiconductor devices. Under high temperature operations, the three-layer structure would crack or peel off, leading to poor grounding and device damages.

In view of these facts and for overcoming the drawback stated above, the present invention provides an improved structure of the backside copper metallization a fabrication method thereof for semiconductor devices that can sustain high temperature operations. The improved structure and the fabrication method thereof according to the present invention can also improve the thermal conductivity of the semiconductor chip with a lower production cost.

SUMMARY OF THE INVENTION

The main object of the present invention is to provide an improved structure of the backside copper metallization a fabrication method thereof for semiconductor devices that can sustain high temperature operations.

To reach the objects stated above, the present invention provides an improved structure of the backside copper metallization for semiconductor devices, which comprises an active layer, a substrate, a backside metal seed layer, a high-temperature sustaining buffer layer and a backside metal layer. The active layer is formed on a front side of the substrate and the active layer includes at least one integrated circuit. The backside metal seed layer is formed on a backside of the substrate and the backside metal seed layer contains Pd and P. The high-temperature sustaining buffer layer is formed below the backside metal seed layer. The backside metal layer formed below the high-temperature sustaining buffer layer and the backside metal layer is made of Cu.

In implementation, the distribution of Pd contained in said backside metal seed layer is at least partially overlapped with the distribution of P contained in said backside metal seed layer.

In implementation, the Pd contained in the backside metal seed layer is distributed closer to the backside of the substrate while the P contained in the backside metal seed layer is distributed closer to the high-temperature sustaining buffer layer.

In implementation, the Pd contained in the backside metal seed layer is uniformly distributed in the backside metal seed layer and the P contained in the backside metal seed layer is uniformly distributed in the backside metal seed layer.

In implementation, the backside metal seed layer includes a first sub-layer and a second sub-layer, the first sub-layer is made of Pd and the second sub-layer is made of P.

In implementation, the first sub-layer is formed on the backside of the substrate, the second sub-layer is formed below the first sub-layer and the high-temperature sustaining buffer layer is formed below the second sub-layer.

In implementation, the high-temperature sustaining buffer layer is formed of Ni, Ag, or Ni alloys.

In implementation, the thickness of the high-temperature sustaining buffer layer is larger than 10 Å and smaller than 10000 Å, larger than 20 Å and smaller than 10000 Å, larger than 30 Å and smaller than 10000 Å, larger than 50 Å and smaller than 10000 Å, larger than 80 Å and smaller than 10000 Å, larger than 100 Å and smaller than 10000 Å, larger than 10 Å and smaller than 9800 Å, larger than 10 Å and smaller than 9500 Å, larger than 10 Å and smaller than 9300 Å or larger than 10 Å and smaller than 9000 Å.

In implementation, further comprising at least one oxidation resistant layer, wherein the at least one oxidation resistant layer is formed below the backside metal layer.

In implementation, the at least one oxidation resistant layer is selected from the group consisting of Ni, Au, Pd, V, Ni—Au alloys, Ni—Pd alloys, Pd—Au alloys, Ni alloys and Ni—V alloys.

In implementation, further comprising at least one via hole, wherein the at least one via hole is formed on the backside of the substrate, an interior surface of the at least one via hole is covered by the backside metal seed layer.

In implementation, the thickness of the backside metal seed layer is larger than 10 Å and smaller than 10000 Å, larger than 20 Å and smaller than 10000 Å, larger than 30 Å and smaller than 10000 Å, larger than 50 Å and smaller than 10000 Å, larger than 80 Å and smaller than 10000 Å, larger than 100 Å and smaller than 10000 Å, larger than 10 Å and smaller than 9800 Å, larger than 10 Å and smaller than 9500 Å, larger than 10 Å and smaller than 9300 Å or larger than 10 Å and smaller than 9000 Å.

The present invention further provides a fabrication method of an improved structure of the backside copper metallization for semiconductor devices, which comprises the following steps: A1: forming an active layer on a front side of a substrate, wherein the active layer includes at least one integrated circuit; A2: depositing a backside metal seed layer on a backside of the substrate to cover the backside of the substrate, wherein the backside metal seed layer contains Pd and P; A3: depositing a high-temperature sustaining buffer layer covering on the backside metal seed layer; and A4: depositing a backside metal layer covering on the high-temperature sustaining buffer layer, and the material for the backside metal layer is Cu.

In implementation, the distribution of Pd contained in said backside metal seed layer is at least partially overlapped with the distribution of P contained in said backside metal seed layer.

In implementation, the step A2 further comprises the steps of: depositing a first sub-layer of the backside metal seed layer on the backside of the substrate, wherein the first sub-layer is made of Pd; and depositing a second sub-layer of the backside metal seed layer below the first sub-layer, wherein the second sub-layer is made of P, wherein the high-temperature sustaining buffer layer is formed below the second sub-layer of the backside metal seed layer.

In implementation, the Pd contained in the backside metal seed layer is distributed closer to the backside of the substrate while the P contained in the backside metal seed layer is distributed closer to the high-temperature sustaining buffer layer.

In implementation, further comprising a step of: fabricating at least one via hole on the backside of the substrate by using photolithography and etching technologies, wherein an interior surface of the at least one via hole is covered by the backside metal seed layer.

In implementation, the high-temperature sustaining buffer layer is formed of Ni, Ag, or Ni alloys.

In implementation, the thickness of the high-temperature sustaining buffer layer is larger than 10 Å and smaller than 10000 Å, larger than 20 Å and smaller than 10000 Å, larger than 30 Å and smaller than 10000 Å, larger than 50 Å and smaller than 10000 Å, larger than 80 Å and smaller than 10000Å, larger than 100 Å and smaller than 10000 Å, larger than 10 Å and smaller than 9800 Å, larger than 10 Å and smaller than 9500 Å, larger than 10 Å and smaller than 9300 Å or larger than 10 Å and smaller than 9000 Å.

In implementation, further comprising the following steps: defining at least one street area on the backside metal layer by photolithograph; etching the backside metal layer within the at least one street area; terminating the etching process at the high-temperature sustaining buffer layer to form streets on the backside metal layer; and depositing at least one oxidation resistant layer covering on the backside metal layer and the streets to prevent metal oxidations.

In implementation, the at least one oxidation resistant layer is selected from the group consisting of Ni, Au, Pd, V, Ni—Au alloys, Ni—Pd alloys, Pd—Au alloys, Ni alloys and Ni—V alloys.

In implementation, the thickness of the backside metal seed layer is larger than 10 Å and smaller than 10000 Å, larger than 20 Å and smaller than 10000 Å, larger than 30 Å and smaller than 10000 Å, larger than 50 Å and smaller than 10000 Å, larger than 80 Å and smaller than 10000 Å, larger than 100 Å and smaller than 10000 Å, larger than 10 Å and smaller than 9800 Å, larger than 10 Å and smaller than 9500 Å, larger than 10 Å and smaller than 9300 Å or larger than 10 Å and smaller than 9000 Å.

For further understanding the characteristics and effects of the present invention, some preferred embodiments referred to drawings are in detail described as follows.

DETAILED DESCRIPTIONS OF PREFERRED EMBODIMENTS

Figure 1:
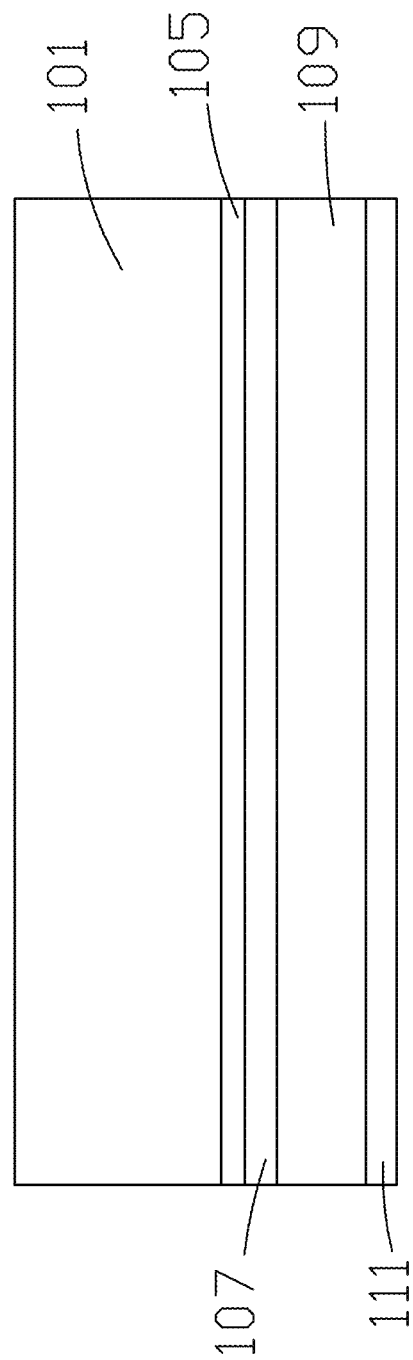
FIG. 1 is a schematic showing the cross-sectional view of the structure of backside copper metallization for semiconductor devices according to a previous technology.
Figure 2A:
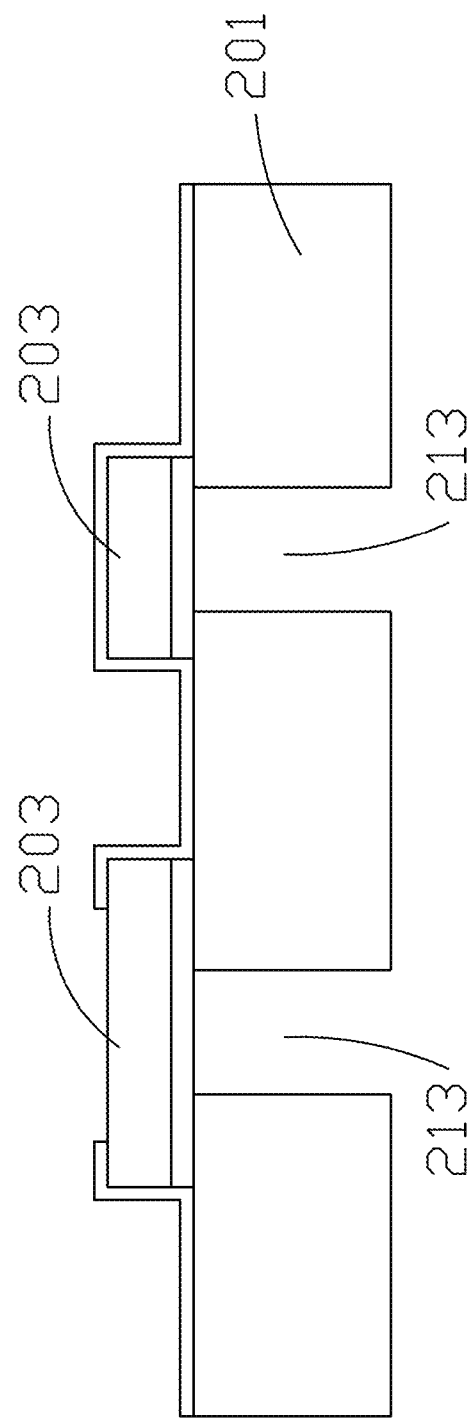
FIG. 2A is a schematic showing the cross-sectional view of the structure of semiconductor devices according to an embodiment of the present invention before the backside copper metallization.

FIG. 2A is a schematic showing the cross-sectional view of the structure of semiconductor devices according to an embodiment of the present invention before the backside copper metallization, which comprises a substrate 201, an active layer 203 and at least one via hole 213. The substrate 201 is formed preferably of semiconductor materials, such as GaAs, InP, GaN, SiC, etc. The active layer 203 is disposed on the front side of the substrate 201, and the active layer 203 includes at least one integrated circuit. The integrated circuit in the active layer 203 needs groundings. Therefore a requested number of backside via holes 213 are formed on the backside of the substrate 201 by using photolithography and etching technologies. The grounding points of the integrated circuit in the active layer 203 can be connected to a remote grounding pad through the backside via holes 213.

Figure 2B:
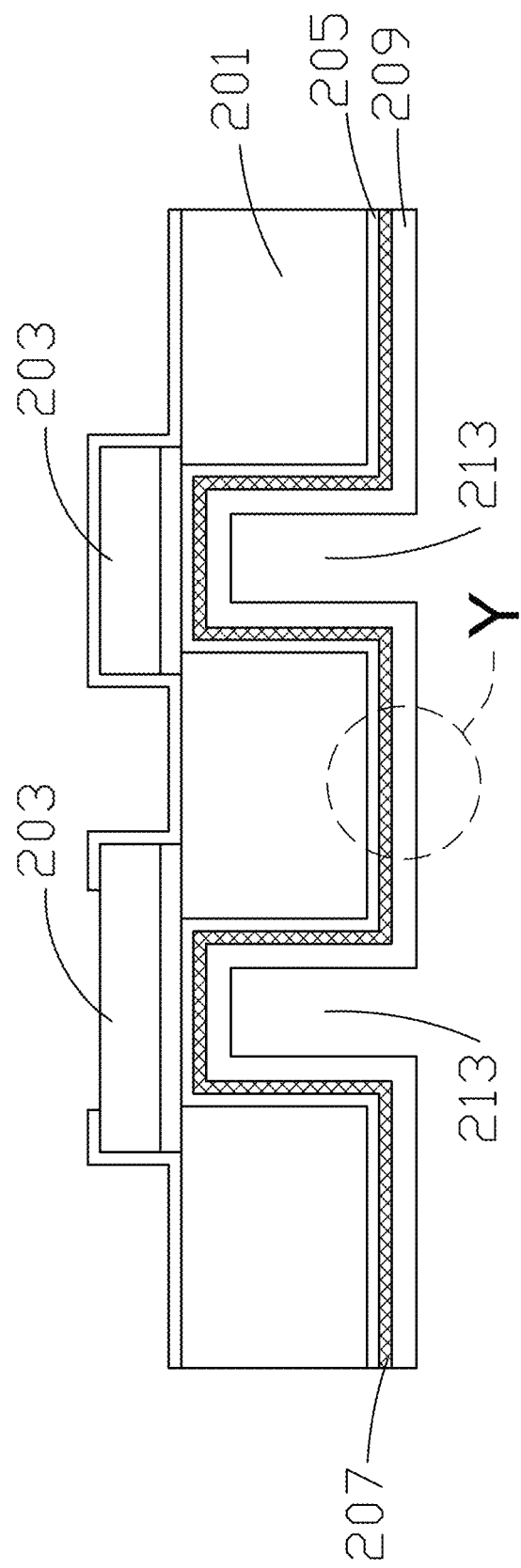
FIG. 2B is a schematic showing the cross-sectional view of the structure of backside copper metallization of semiconductor devices according to an embodiment of the present invention.

FIG. 2B is a cross-sectional view of the structure of backside copper metallization for semiconductor devices according to an embodiment of the present invention. The main structure is basically the same as the structure shown in FIG. 2A, except that a backside metal seed layer 205 is formed on a backside of the substrate 201, a high-temperature sustaining buffer layer 207 is formed below the backside metal seed layer 205 and a backside metal layer 209 is formed below the high-temperature sustaining buffer layer 207. The backside metal seed layer 205 covers the backside of the substrate 201 and the interior surface of the via holes 213. The backside metal seed layer 205 contains Pd and P. The preferable materials for the high-temperature sustaining buffer layer 207 are Ni, Ag, or Ni alloys. The backside metal layer 209 is made of Cu.

In an embodiment, the distribution of Pd contained in the backside metal seed layer 205 is at least partially overlapped with the distribution of P contained in the backside metal seed layer 205. In an embodiment, the Pd and P contained in the backside metal seed layer 205 may be a mixture. In an embodiment, the Pd and P contained in the backside metal seed layer 205 may be partially mixed. In an embodiment, the Pd and P contained in the backside metal seed layer 205 may be uniformly mixed, wherein the Pd contained in the backside metal seed layer 205 is uniformly distributed in the backside metal seed layer 205 and the P contained in the backside metal seed layer 205 is uniformly distributed in the backside metal seed layer 205. In an embodiment, partial of the Pd and P contained in the backside metal seed layer 205 may be uniformly mixed.

In another embodiment, The Pd contained in the backside metal seed layer 205 is distributed closer to the backside of the substrate 201 while the P contained in the backside metal seed layer 205 is distributed closer to the high-temperature sustaining buffer layer 207.

The backside metal seed layer 205 containing Pd and P may act as a diffusion barrier for preventing the Cu metal of the backside metal layer 209 diffusing into the substrate 201. Using Pd as part of the materials for the backside metal seed layer 205 may also improve the adhesion to the substrate 201. Furthermore, using P as part of the materials for the backside metal seed layer 205 may highly preventing the Cu metal of the backside metal layer 209 diffusing into the substrate 201.

Figure 2C:
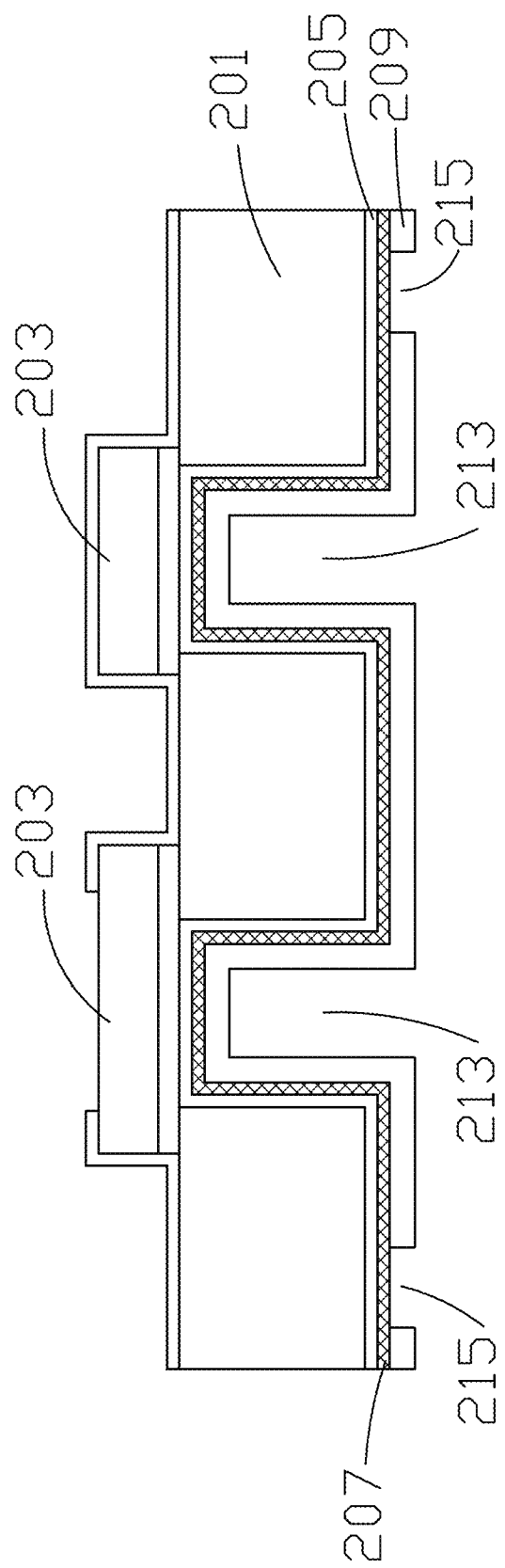
FIG. 2C is a schematic showing the cross-sectional view of the structure of backside copper metallization for semiconductor devices according to an embodiment of the present invention after forming streets by etching the backside metal layer.

FIG. 2C is a schematic showing the cross-sectional view of the structure of backside copper metallization for semiconductor devices according to an embodiment of the present invention with streets on the backside metal layer. The main structure is basically the same as the structure shown in FIG. 2B, except that the streets 215 on the backside metal layer 209 are formed. The streets 215 is formed by first defining at least one street area on the backside metal layer 209 by photolithograph, and then etching the backside metal layer 209 within the at least one street area and terminating the etching process at the high-temperature sustaining buffer layer 207.

Figure 2D:
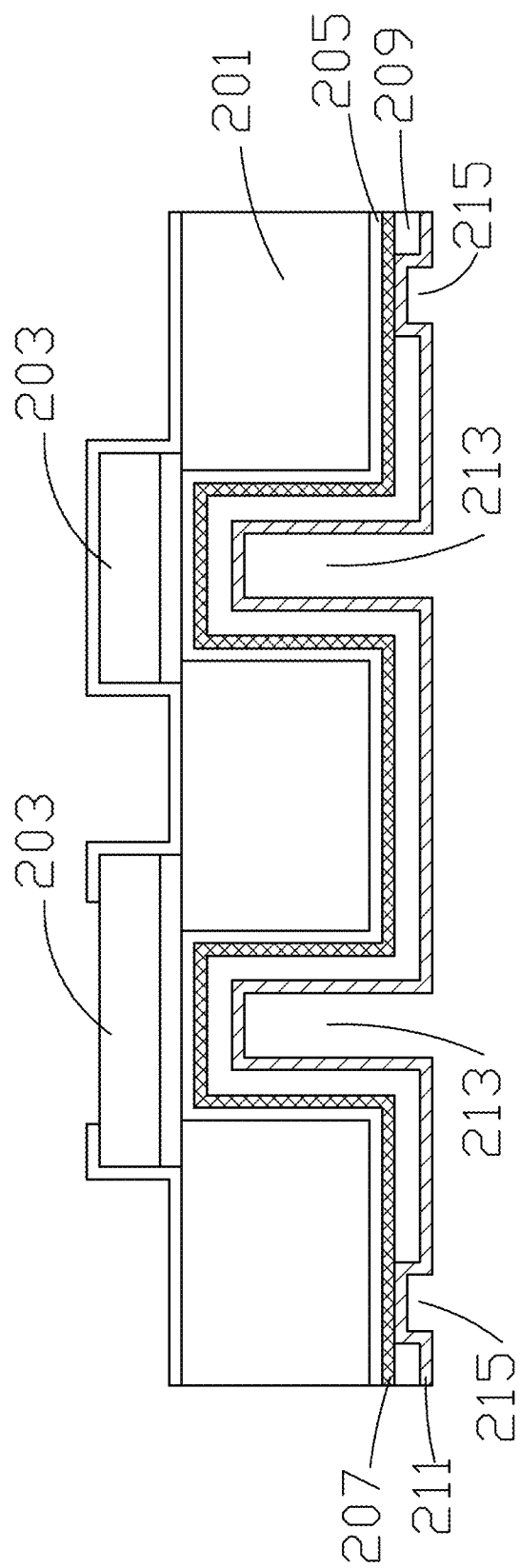
FIG. 2D is a schematic showing the cross-sectional view of the structure of backside copper metallization for semiconductor devices according to an embodiment of the present invention after depositing at least one oxidation resistant layer.

FIG. 2D is a schematic showing the cross-sectional view of the structure of backside copper metallization for semiconductor devices according to an embodiment of the present invention with an oxidation resistant layer. The main structure is basically the same as the structure shown in FIG. 2C, except that at least one oxidation resistant layer 211 is formed below the backside metal layer 209. The backside metal layer 209 and the streets 215 are thus covered with the at least one oxidation resistant layer 211 and thereby preventing the oxidation of the backside metal layer 209. The oxidation resistant layer 211 is selected from the group consisting of Ni, Au, Pd, V, Ni—Au alloys, Ni—Pd alloys, Pd—Au alloys, Ni alloys and Ni—V alloys. In a preferable embodiment, the oxidation resistant layer 211 includes an Au layer and a Ni-V alloys layer.

Figure 2E:
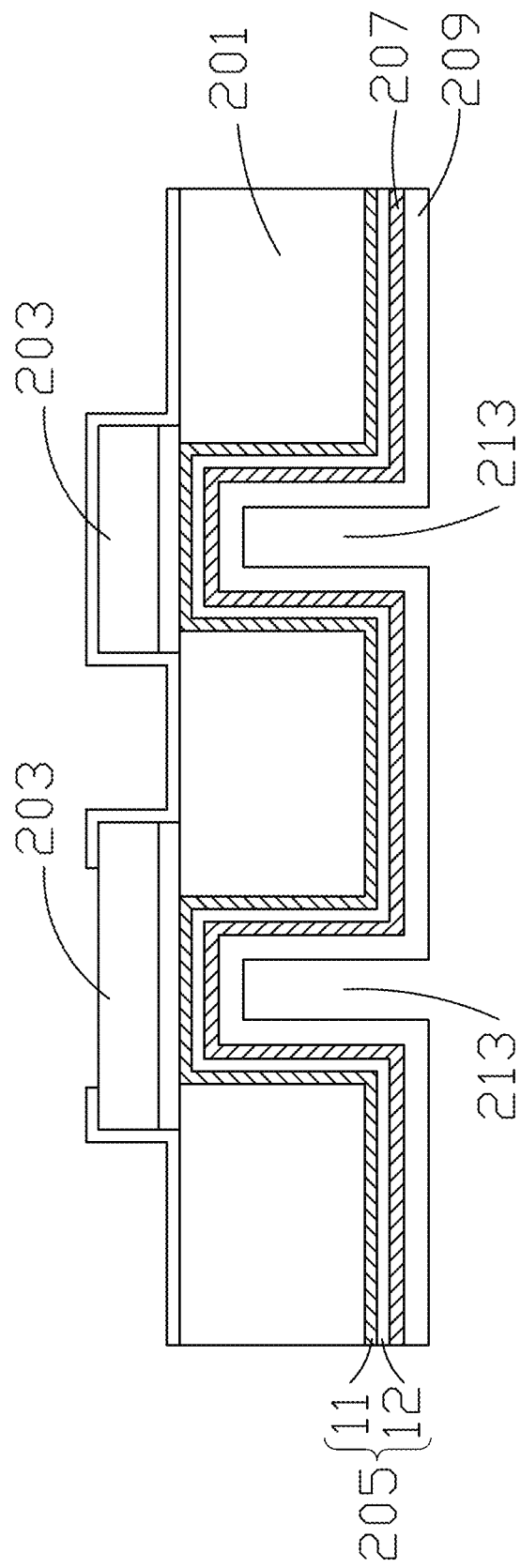
FIG. 2E is a schematic showing the cross-sectional view of the structure of backside copper metallization of semiconductor devices according to another embodiment of the present invention.

FIG. 2E is a schematic showing the cross-sectional view of the structure of backside copper metallization of semiconductor devices according to another embodiment of the present invention. The main structure is basically the same as the structure shown in FIG. 2B, except that the backside metal seed layer 205 includes a first sub-layer 11 and a second sub-layer 12. The first sub-layer 11 is made of Pd and is formed on the backside of the substrate 201. The second sub-layer 12 is made of P and is formed below the first sub-layer 11. And the high-temperature sustaining buffer layer 207 is formed below the second sub-layer 12. Since Pd may improve the adhesion to the substrate 201, hence, the first sub-layer 11 of the backside metal seed layer 205 is designed to be formed on the backside of the substrate 201. And since P may highly preventing the Cu metal of the backside metal layer 209 diffusing into the substrate 201, hence, the second sub-layer 12 of the backside metal seed layer 205 is designed to be formed between the first sub-layer 11 and the high-temperature sustaining buffer layer 207.

Figure 2F:
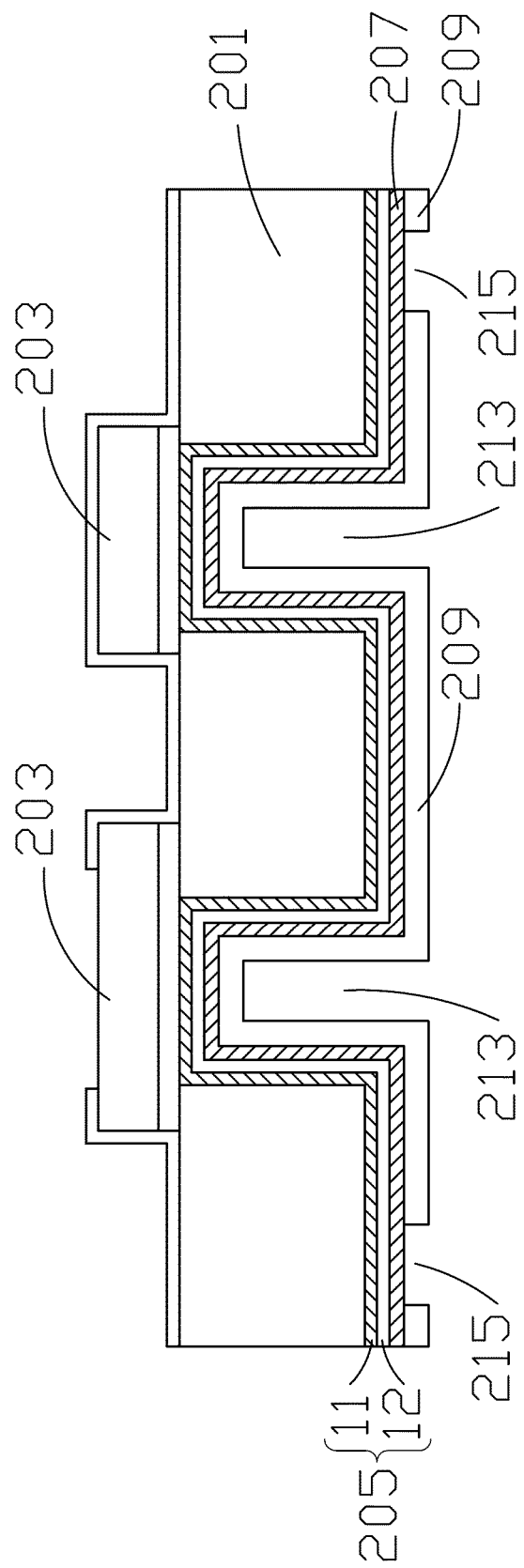
FIG. 2F is a schematic showing the cross-sectional view of the structure of backside copper metallization for semiconductor devices according to another embodiment of the present invention after forming streets by etching the backside metal layer.

FIG. 2F is a schematic showing the cross-sectional view of the structure of backside copper metallization for semiconductor devices according to another embodiment of the present invention with streets on the backside metal layer. The main structure is basically the same as the structure shown in FIG. 2E, except that the streets 215 on the backside metal layer 209 are formed. The streets 215 is formed by first defining at least one street area on the backside metal layer 209 by photolithograph, and then etching the backside metal layer 209 within the at least one street area and terminating the etching process at the high-temperature sustaining buffer layer 207.

Figure 2G:
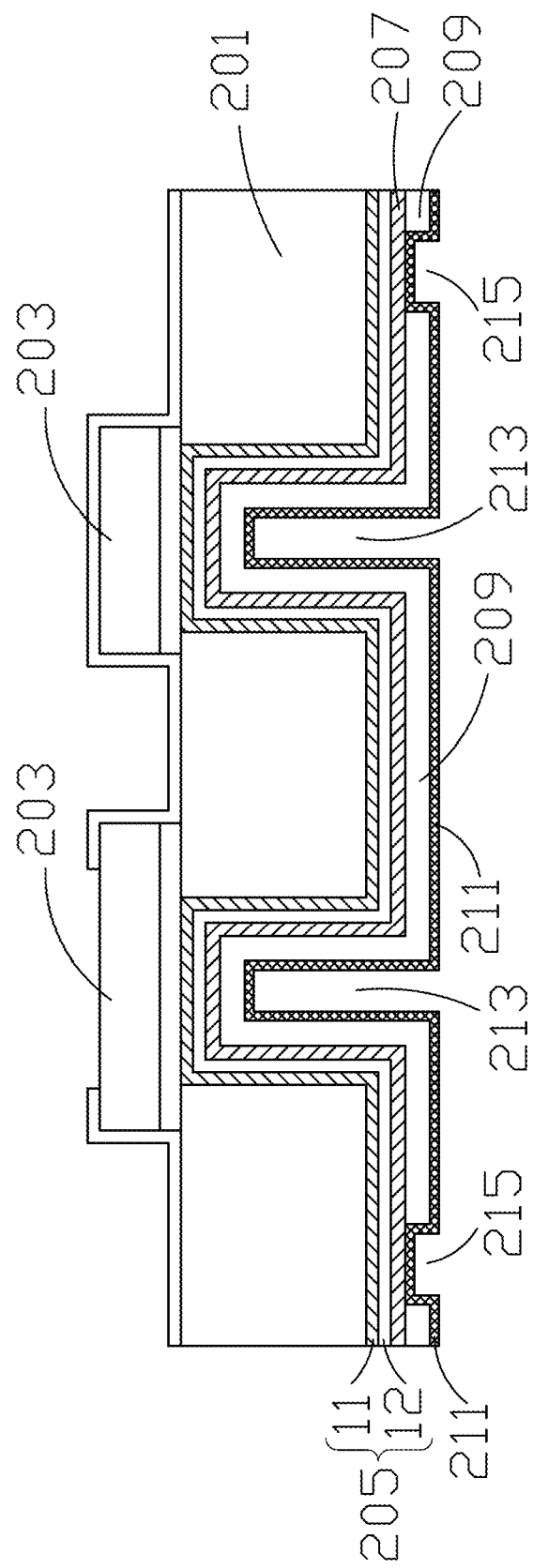
FIG. 2G is a schematic showing the cross-sectional view of the structure of backside copper metallization for semiconductor devices according to another embodiment of the present invention after depositing at least one oxidation resistant layer.

FIG. 2G is a schematic showing the cross-sectional view of the structure of backside copper metallization for semiconductor devices according to another embodiment of the present invention with an oxidation resistant layer. The main structure is basically the same as the structure shown in FIG. 2F, except that at least one oxidation resistant layer 211 is formed below the backside metal layer 209. The backside metal layer 209 and the streets 215 are thus covered with the at least one oxidation resistant layer 211 and thereby preventing the oxidation of the backside metal layer 209. The oxidation resistant layer 211 is selected from the group consisting of Ni, Au, Pd, V, Ni—Au alloys, Ni—Pd alloys, Pd—Au alloys, Ni alloys and Ni—V alloys. In a preferable embodiment, the oxidation resistant layer 211 includes an Au layer and a Ni—V alloys layer.

In the present invention, the main object is to provide an improved structure of the backside copper metallization a fabrication method thereof for semiconductor devices that can sustain high temperature operations. The improved structure of the backside copper metallization must sustain high temperature testing (350 degrees in C, 30 minutes). Hence, the design of the improved structure of the backside copper metallization must be integrated. The backside metal seed layer 205 must have good adhesion to the substrate 201 (GaAs). The Pd contained in the backside metal seed layer 205 has excellent adhesion to the substrate 201 (GaAs). And there must be a layer act as a diffusion barrier for preventing the diffusion of the Cu metal of the backside metal layer 209 into the substrate 201. The Pd contained in the backside metal seed layer 205 may act as a diffusion barrier for preventing some part of the Cu metal of the backside metal layer 209 into the substrate 201. However, Pd is not good enough. Hence, in the present invention, the improved structure comprises the backside metal seed layer 205 containing Pd and P. P may act as an excellent diffusion barrier for preventing some part of the Cu metal of the backside metal layer 209 into the substrate 201. And in the backside metal seed layer 205, the P contained in the backside metal seed layer 205 is distributed closer to the high-temperature sustaining buffer layer 207 while the Pd contained in the backside metal seed layer 205 is distributed closer to the backside of the substrate 201. Hence, Pd may act as an excellent adhesion while P may act as an excellent diffusion barrier. The high-temperature sustaining buffer layer 207 is made of Ni, Ni alloys or Ag. The main reason to choose Ni, Ni alloys or Ag is the consideration of miscibility between adjacent metals. The backside metal layer 209 (Cu) and the high-temperature sustaining buffer layer 207 (Ni, Ni alloys or Ag) have excellent miscibility at 350 degrees in C. Hence, after the high temperature testing (350 degrees in C, 30 minutes), the backside metal layer 209 (Cu) and the high-temperature sustaining buffer layer 207 (Ni, Ni alloys or Ag) will be mixed with each other at the nearby boundary. Similarly, the high-temperature sustaining buffer layer 207 (Ni, Ni alloys or Ag) and the backside metal seed layer 205 (Pd) have excellent miscibility at 350 degrees in C. Hence, after the high temperature testing (350 degrees in C, 30 minutes), the high-temperature sustaining buffer layer 207 (Ni, Ni alloys or Ag) and the backside metal seed layer 205 (Pd) will be mixed with each other at the nearby boundary. As a preferable embodiment, the design of the improved structure of backside copper metallization comprises the backside metal seed layer 205 containing Pd and P, the high-temperature sustaining buffer layer 207 (Ni, Ni alloys or Ag), and the backside metal layer 209 (Cu). The devices design of the improved structure of backside copper metallization can sustain higher temperature operations (350 degrees in C, 30 minutes). There is no metal peeling or poor device grounding found in devices after high-temperature tests. Hence, the device reliability can be significantly improved.

Figure 2H:
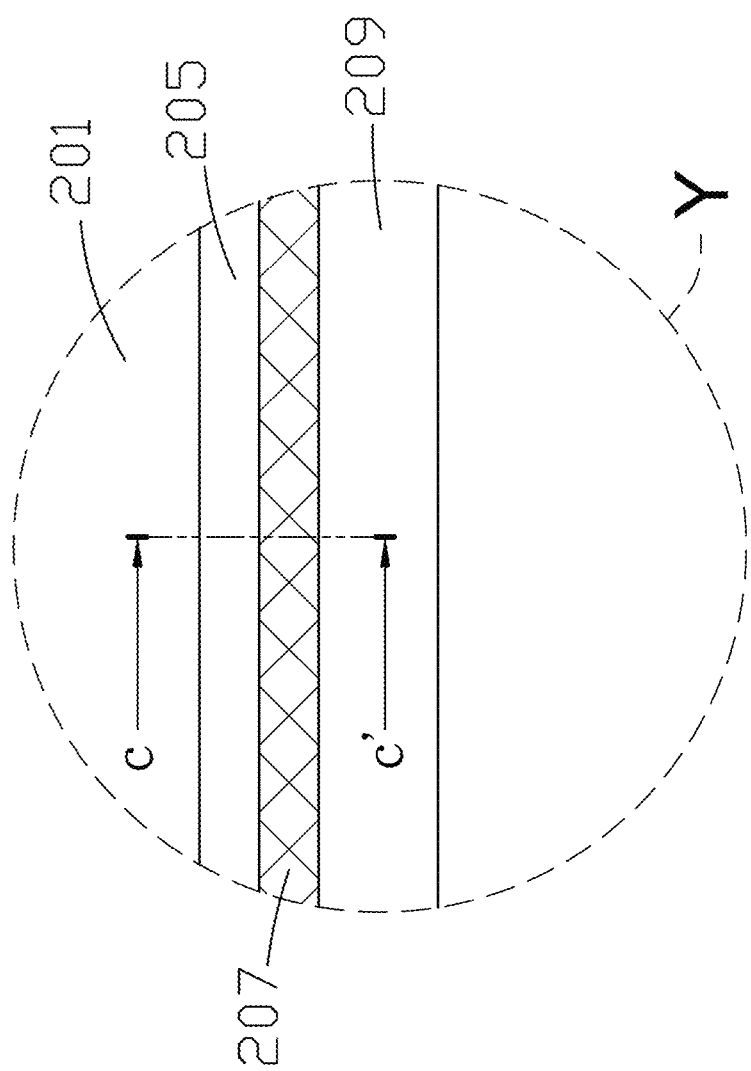
FIG. 2H is a partial enlargement view of FIG. 2B.
Figure 3A:
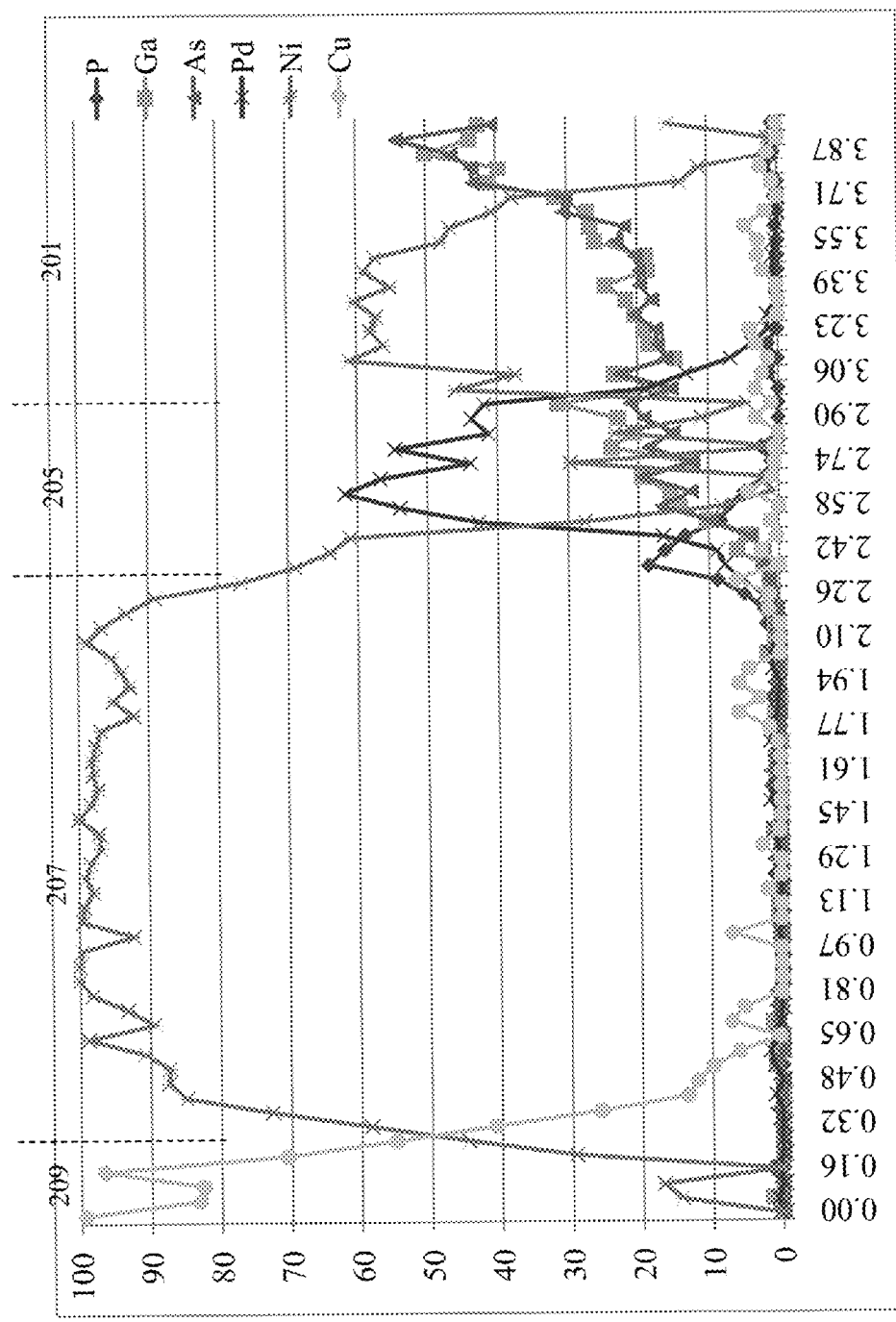
FIG. 3A is a partial (along the line c-c' in FIG. 2H) result of the EDS (Energy-dispersive X-ray Spectroscopy) analysis of the structure of backside copper metallization of semiconductor devices according to an embodiment of the present invention after high temperature testing.
Figure 3B:
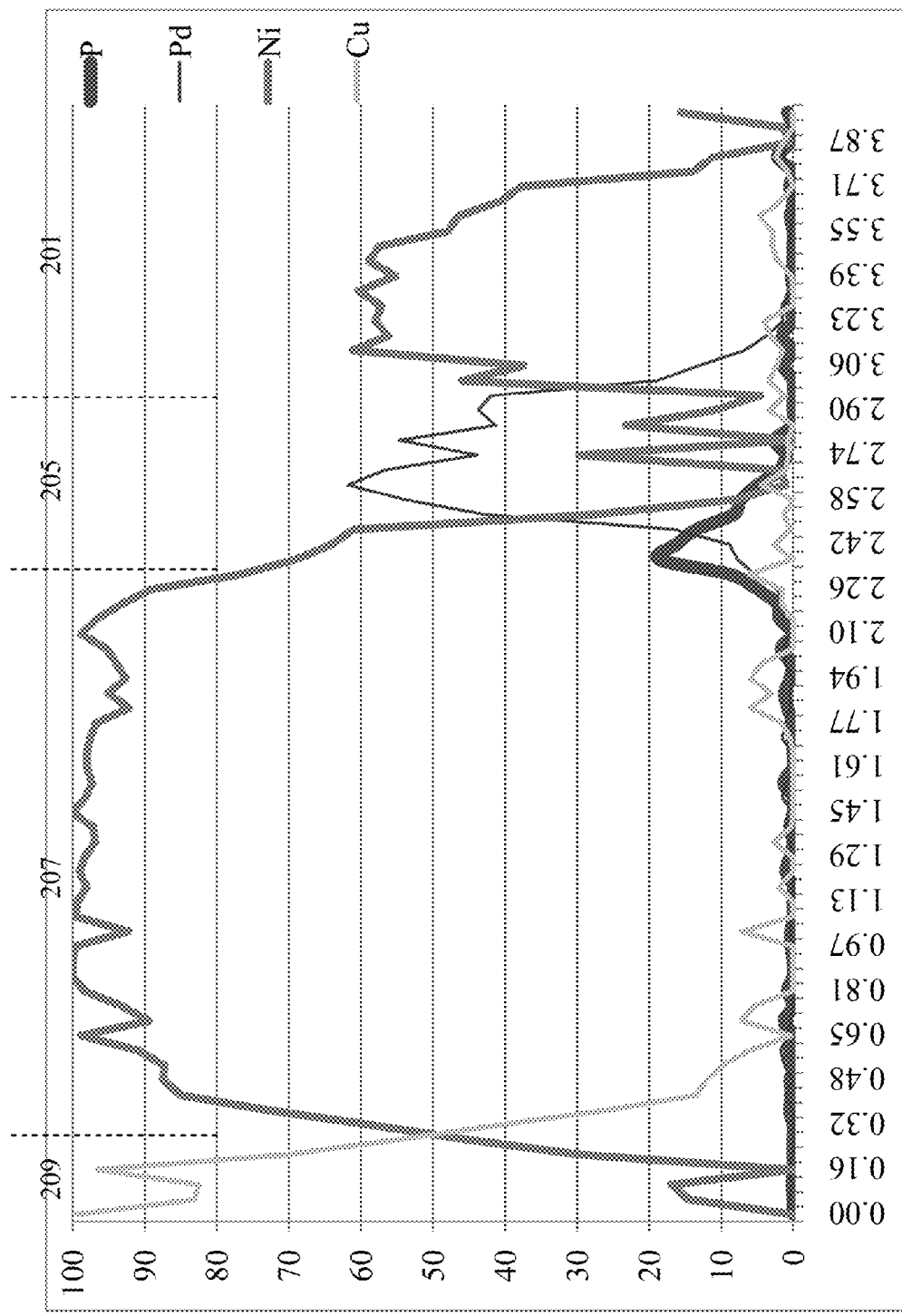
FIG. 3B is a partial of FIG. 3A.

FIG. 2H is a partial enlargement view of FIG. 2B. FIG. 3A is the result of the EDS (Energy-dispersive X-ray Spectroscopy) analysis of the structure of backside copper metallization of semiconductor devices according to an embodiment of the present invention after high temperature testing. The result shown in FIG. 3A is along the line c-c'in FIG. 2H. In FIG. 3A, it is very clear that after high temperature testing (350 degrees in C, 30 minutes), the backside metal layer 209 (Cu) and the high-temperature sustaining buffer layer 207 (Ni) are mixed at the nearby boundary. There is no obvious boundary between the backside metal layer 209 (Cu) and the high-temperature sustaining buffer layer 207 (Ni). Similarly, after high temperature testing (350 degrees in C, 30 minutes), the high-temperature sustaining buffer layer 207 (Ni) and the backside metal seed layer 205 (P, Pd) are mixed at the nearby boundary. Even more, the high-temperature sustaining buffer layer 207 (Ni) is diffused into the backside of the substrate 201 (GaAs) and mixed with part of the substrate 201 (GaAs). The backside metal seed layer 205 (P, Pd) contains P and Pd. As you can see, the Pd contained in the backside metal seed layer 205 is distributed closer to the backside of the substrate 201 while the P contained in the backside metal seed layer 205 is distributed closer to the high-temperature sustaining buffer layer 207. Similarly, after high temperature testing (350 degrees in C, 30 minutes), the backside metal seed layer 205 (P, Pd) and the substrate 201 (GaAs) are mixed at the nearby boundary (especially the Pd contained in the backside metal seed layer 205, the side closer to the substrate 201). The P contained in the backside metal seed layer 205 is for preventing the Cu metal of the backside metal layer 209 diffusing into the substrate 201. As the result, some part of the Cu metal of the backside metal layer 209 diffused into the high-temperature sustaining buffer layer 207 (Ni). Even a little part of the Cu metal of the backside metal layer 209 diffused into the P contained in the backside metal seed layer 205. However, basically the P contained in the backside metal seed layer 205 prevented most of the Cu metal of the backside metal layer 209 diffused into the substrate 201. Only very little tiny part of the Cu metal of the backside metal layer 209 diffused into the substrate 201. Please also refer to FIG. 3B which shown a partial of FIG. 3A. FIG. 3B is basically the same as FIG. 3A, except that the substrate 201 (GaAs) is not shown. From FIG. 3B, it is clearer to see the distribution of P contained in the backside metal seed layer 205 and the Cu metal of the backside metal layer 209.

The thickness of the high-temperature sustaining buffer layer 207 is larger than 10 Å and smaller than 10000 Å, larger than 20 Å and smaller than 10000 Å, larger than 30 Å and smaller than 10000 Å, larger than 50 Å and smaller than 10000 Å, larger than 80 Å and smaller than 10000 Å, larger than 100 Å and smaller than 10000 Å, larger than 10 Å and smaller than 9800 Å, larger than 10 Å and smaller than 9500 Å, larger than 10 Å and smaller than 9300 Å or larger than 10 Å and smaller than 9000 Å.

The thickness of the backside metal seed layer 205 is larger than 10 Å and smaller than 10000 Å, larger than 20 Å and smaller than 10000 Å, larger than 30 Å and smaller than 10000 Å, larger than 50 Å and smaller than 10000 Å, larger than 80 Å and smaller than 10000 Å, larger than 100 Å and smaller than 10000 Å, larger than 10 Å and smaller than 9800 Å, larger than 10 Å and smaller than 9500 Å, larger than 10 Å and smaller than 9300 Å or larger than 10 Å and smaller than 9000 Å.

The fabrication method of the improved structure of backside copper metallization for semiconductor devices provided by the present invention comprises the following steps: A1: forming an active layer 203 on a front side of a substrate 201, wherein the active layer 203 includes at least one integrated circuit; A2: depositing a backside metal seed layer 205 on a backside of the substrate 201 to cover the backside of the substrate 201, wherein the backside metal seed layer 205 contains Pd and P; A3: depositing a high-temperature sustaining buffer layer 207 covering on the backside metal seed layer 205; and A4: depositing a backside metal layer 209 covering on the high-temperature sustaining buffer layer 207, and the material for the backside metal layer is Cu. The Pd contained in the backside metal seed layer 205 is distributed closer to the backside of the substrate 201 while the P contained in the backside metal seed layer 205 is distributed closer to the high-temperature sustaining buffer layer 207.

The fabrication method may further comprise a step of: fabricating at least one via hole 213 on the backside of the substrate 201 by using photolithography and etching technologies, wherein an interior surface of the at least one via hole 213 is covered by the backside metal seed layer 205.

Furthermore, the step A2 may further comprises the following steps: depositing a first sub-layer 11 of the backside metal seed layer 205 on the backside of the substrate 201, wherein the first sub-layer 11 is made of Pd; and depositing a second sub-layer 12 of the backside metal seed layer 205 below the first sub-layer 11, wherein the second sub-layer 12 is made of P, wherein the high-temperature sustaining buffer layer 207 is formed below the second sub-layer 12 of the backside metal seed layer 205.

The fabrication method may further comprise the following steps: defining at least one street area on the backside metal layer 209 by photolithograph; etching the backside metal layer 209 within the at least one street area; terminating the etching process at the high-temperature sustaining buffer layer 207 to form streets 215 on the backside metal layer 209; and depositing at least one oxidation resistant layer 211 covering on the backside metal layer 209 and the streets 215 to prevent metal oxidations.

To sum up, by using the three-layer structure comprising the backside metal seed layer 205 (Pd, P), the high-temperature sustaining buffer layer 207 (Ni, Ni alloys or Ag), and the backside metal layer 209 (Cu) provided by the present invention, in combination with the choice of the material for the three-layer structure, the temperature resistance of such a three-layer structure is increased. No metal peeling or poor grounding was found in devices after high-temperature tests, indicating that the device reliability has been improved. And the Cu metal of the backside metal layer 209 diffusing into the substrate 201 is prevented. The present invention indeed can get its anticipatory object, and provide fabrication processes that can improve the device reliability.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. An improved structure of backside copper metallization for semiconductor devices comprising:
   a substrate, wherein said substrate is made of GaAs, InP, GaN or SiC;
   an active layer formed on a front side of said substrate, wherein said active layer includes at least one integrated circuit;
   a backside metal seed layer formed on a backside of said substrate, wherein said backside metal seed layer contains Pd and P;
   a high-temperature sustaining buffer layer formed below said backside metal seed layer, wherein said high-temperature sustaining layer is made of Ni alloys, Ni or Ag; and
   a backside metal layer formed below said high-temperature sustaining buffer layer, wherein said backside metal layer is made of Cu;
   wherein the Pd contained in said backside metal seed layer is uniformly distributed in said backside metal seed layer and the P contained in said backside metal seed layer is uniformly distributed in said backside metal seed layer; and
   wherein at high temperature the Pd contained in said backside metal seed layer is distributed closer to said backside of said substrate while the P contained in said backside metal seed layer is distributed closer to said high-temperature sustaining buffer layer, and thereby said high-temperature sustaining buffer layer and the P contained in said backside metal seed layer are mixed at the nearby boundary.

2. The improved structure of backside copper metallization for semiconductor devices according to claim 1, wherein said high-temperature sustaining buffer layer is made of Ni alloys.

3. The improved structure of backside copper metallization for semiconductor devices according to claim 1, wherein said high-temperature sustaining buffer layer is made of Ni.

4. The improved structure of backside copper metallization for semiconductor devices according to claim 1, wherein said high-temperature sustaining buffer layer is made of Ag.

5. The improved structure of backside copper metallization for semiconductor devices according to claim 1, further comprising at least one oxidation resistant layer, wherein said at least one oxidation resistant layer is formed below said backside metal layer.

6. The improved structure of backside copper metallization for semiconductor devices according to claim 5, wherein said at least one oxidation resistant layer is selected from the group consisting of Ni, Au, Pd, V, Ni—Au alloys, Ni—Pd alloys, Pd—Au alloys, Ni alloys and Ni—V alloys.

7. The improved structure of backside copper metallization for semiconductor devices according to claim 1, further comprising at least one via hole, wherein said at least one via hole is formed on said backside of said substrate, an interior surface of said at least one via hole is covered by said backside metal seed layer.

8. The improved structure of backside copper metallization for semiconductor devices according to claim 1, wherein a thickness of said high-temperature sustaining buffer layer is larger than 10 Å and smaller than 10000 Å.

9. The improved structure of backside copper metallization for semiconductor devices according to claim 1, wherein a thickness of said high-temperature sustaining buffer layer is larger than 100 Å and smaller than 10000 Å.

10. The improved structure of backside copper metallization for semiconductor devices according to claim 1, wherein a thickness of said high-temperature sustaining buffer layer is larger than 10 Å and smaller than 9000 Å.

11. The improved structure of backside copper metallization for semiconductor devices according to claim 1, wherein a thickness of said backside metal seed layer is larger than 10 Å and smaller than 10000 Å.

12. The improved structure of backside copper metallization for semiconductor devices according to claim 1, wherein a thickness of said backside metal seed layer is larger than 100 Å and smaller than 10000 Å.

13. The improved structure of backside copper metallization for semiconductor devices according to claim 1, wherein a thickness of said backside metal seed layer is larger than 10 Å and smaller than 9000 Å.

14. The improved structure of backside copper metallization for semiconductor devices according to claim 1, wherein said substrate is made of GaAs and said high-temperature sustaining buffer layer is made of Ni.

* * * * *